(12) United States Patent
Fuchi et al.

(10) Patent No.: US 8,793,458 B2
(45) Date of Patent: Jul. 29, 2014

(54) TRANSMISSION APPARATUS AND CONTROL DATA PROCESSING METHOD AND PROGRAM

(75) Inventors: Yasuhiro Fuchi, Fukuoka (JP); Ryuta Hoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 727 days.

(21) Appl. No.: 13/071,777

(22) Filed: Mar. 25, 2011

(65) Prior Publication Data

US 2011/0238930 A1    Sep. 29, 2011

(30) Foreign Application Priority Data

Mar. 29, 2010   (JP) .................................. 2010-75945

(51) Int. Cl.
*G06F 13/00*     (2006.01)
*G06F 13/38*     (2006.01)
(52) U.S. Cl.
CPC ................ *G06F 13/38* (2013.01); *G06F 13/00* (2013.01)
USPC ......................................... 711/165; 711/170
(58) Field of Classification Search
CPC ......... G06F 21/10; G06F 21/78; G06F 21/80; G06F 11/1433; G06F 11/1443
USPC .......... 711/100, 165, 166, 170–173; 710/8, 9, 710/10, 13
See application file for complete search history.

(56) References Cited

U.S. PATENT DOCUMENTS

2005/0131940 A1\* 6/2005 Le Sauze et al. .......... 707/104.1
2009/0323726 A1\* 12/2009 Ochi et al. .................... 370/498

FOREIGN PATENT DOCUMENTS

| JP | 63-137358 A | 6/1988 |
|---|---|---|
| JP | 8-298494 A | 11/1996 |
| JP | 10-285180 A | 10/1998 |
| JP | 2001-223656 A | 8/2001 |
| JP | 2003-283561 A | 10/2003 |
| JP | 2005-522129 A | 7/2005 |
| JP | 2008-131063 A | 6/2008 |

OTHER PUBLICATIONS

Japanese Office Action mailed Oct. 15, 2013 for corresponding Japanese Application No. 2010-075945, with Partial English-language Translation.

\* cited by examiner

*Primary Examiner* — Sanjiv Shah
*Assistant Examiner* — Zhuo Li
(74) *Attorney, Agent, or Firm* — Fujitsu Patent Center (57) ABSTRACT

A transmission apparatus includes a memory and a circuit. The memory store control data included in a frame received from outside the apparatus and state information indicating a state of the control data in the transmission apparatus in association with each other. The circuit records the control data included in the frame to the memory. The circuit changes the state information to information indicating that the recording of the control data is completed. The circuit determines whether or not the control data stored in the memory is to be rewritten. The circuit rewrites the control data stored in the memory, upon determining that the control data is rewritten. The circuit changes the state information to information indicating that the rewriting of the control data is completed. The circuit reads the control data stored in the memory.

12 Claims, 9 Drawing Sheets

TRANSMISSION APPARATUS AND CONTROL DATA PROCESSING METHOD AND PROGRAM

CROSS-REFERENCE TO RELATED APPLICATIONS

This application is based upon and claims the benefit of priority of the prior Japanese Patent Application No. 2010-75945, filed on Mar. 29, 2010, the entire contents of which are incorporated herein by reference.

FIELD

Embodiments discussed herein relate to a transmission apparatus and a control-data processing method and program.

BACKGROUND

Figure 9:
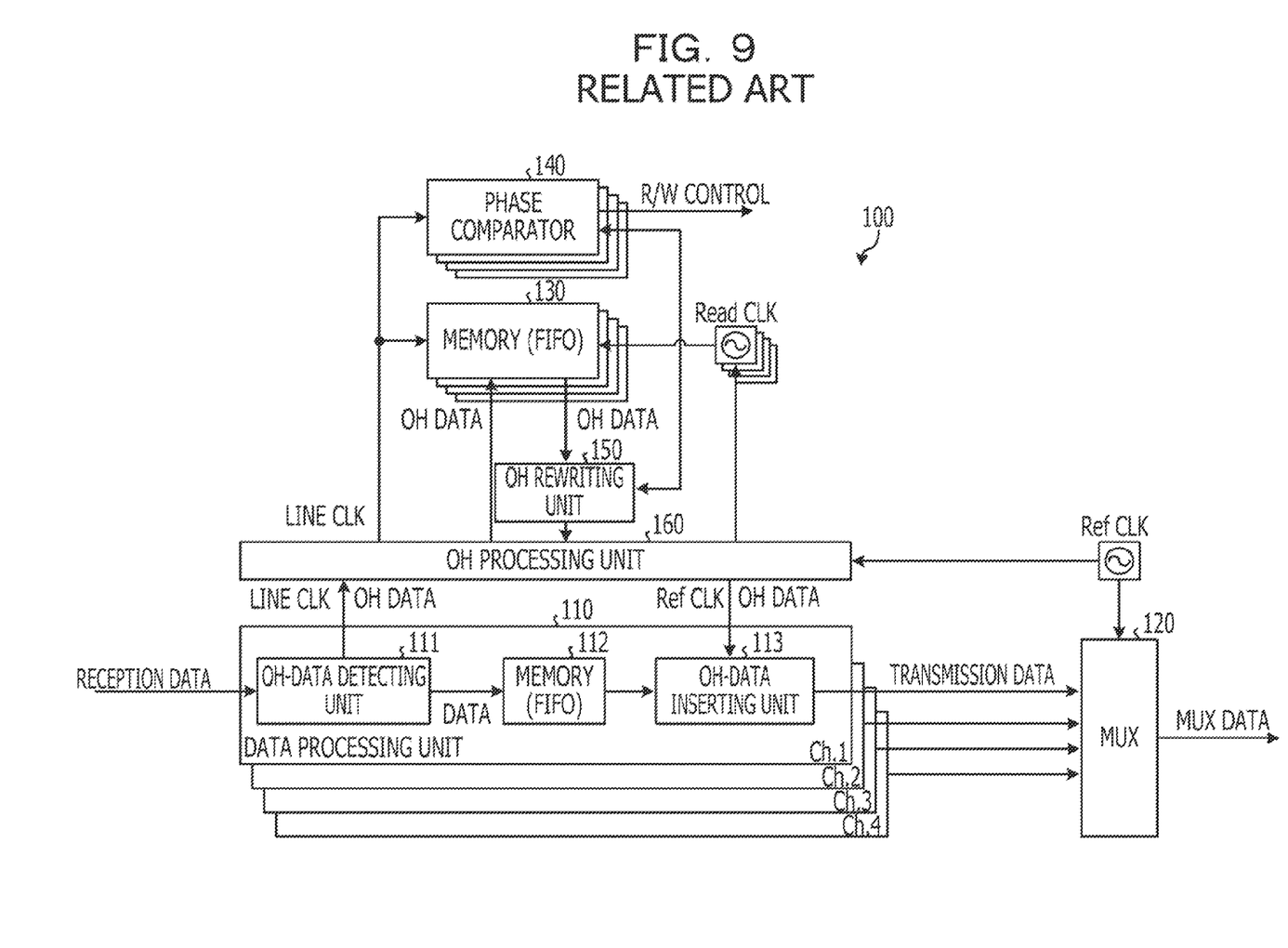
FIG. 9 is a diagram illustrating one example of a transmission apparatus of related art.

A transmission apparatus that multiplexes low-speed signals to transmit the signals in the form of a high-speed frame has been known. FIG. 9 is a diagram illustrating one example of a transmission apparatus 100 of related art. As illustrated in FIG. 9, the transmission apparatus 100 of the related art includes data processing units 110, a multiplexer (MUX) 120, memories 130 (e.g., first-in first-out (FIFO) memories), and phase comparators 140. As illustrated in FIG. 9, the transmission apparatus 100 further includes an overhead (OH) rewriting unit 150 and an OH processing unit 160.

For example, as illustrated in FIG. 9, the transmission apparatus 100 uses the MUX 120 to multiplex the reception data transferred at four different low-speed transfer rates for Ch. (channel) 1 to Ch. 4. As illustrated in FIG. 9, each data processing unit 110 has an OH-data detecting unit 111, a memory 112 (e.g., a FIFO memory), and an OH-data inserting unit 113.

The OH-data detecting unit 111 detects OH data, which is control data contained in the reception data. The memory 112 stores data (hereinafter referred to as "data") other than the OH data contained in the reception data. The OH-data inserting unit 113 inserts OH data read by the OH processing 160 (described below) into the data stored by the memory 112, to thereby generate transmission data. The OH-data inserting unit 113 sends the transmission data to the MUX 120 in synchronization with the phase of a reference clock (Ref CLK) for the transmission data.

The MUX 120 multiplexes the transmission data sent from the Ch. 1 to Ch. 4 data processing units 110 to generate MUX data and sends the MUX data in synchronization with the phase of the Ref CLK. The memories 130 store the OH data recorded by the OH processing unit 160. Each phase comparator 140 outputs a phase difference between a LINE CLK and a Read CLK. The LINE CLK serves as a reference clock for the reception data.

By using the phase difference output from the phase comparator 140 and the Read CLK (which serves as a reference clock for reading the OH data), the OH rewriting unit 150 reads the OH data from the memory (FIFO) 130 and rewrites the read OH data so that OH data indicates an apparatus-setting value or the like. For example, when a failure occurs in a network to which the transmission apparatus 100 belongs, the OH rewriting unit 150 rewrites part of the OH data so that it indicates information of a failed portion or the like.

By using the phase difference output from the phase comparator 140 and the phase of the LINE CLK, the OH processing unit 160 records the OH data detected by the OH-data detecting unit 111 to the corresponding memory 130. The OH processing unit 160 sends the OH data, subjected to the rewriting processing by the OH rewriting unit 150, to the OH-data inserting unit 113 in synchronization with the phase of the Ref CLK.

Thus, the transmission apparatus 100 controls the timings of the recording and reading of the OH data by using the phase difference between the LINE CLK and the Read CLK, to thereby prevent misreading of the OH data recorded in the memories 130. The transmission apparatus 100 asynchronously executes processing on the reception data by using the memories 130, the phase comparators 140, and the Read CLKs corresponding to the respective Ch. 1 to Ch. 4.

Examples of the related art include Japanese Unexamined Patent Application Publication Nos. 8-298494 and 2008-131063.

In the related art, however, there is a problem in that the circuit scale increases. More specifically, in a case in which processing such as rewriting or insertion is to be executed on the OH data, the transmission apparatus 100 of the related art needs to have the phase comparators 140 and the Read CLKs for the respective channels. As a result, there is a problem in that the circuit scale of the transmission apparatus increases.

Accordingly, in view of the above-described problem of the related art, a technology disclosed herein is aimed to provide a control-data processing program, a control-data processing method, and a transmission apparatus which can reduce the circuit scale.

SUMMARY

According to an aspect of the invention, a transmission apparatus includes a memory and a circuit. The memory stores control data included in a frame received from outside the transmission apparatus and state information indicating a state of the control data in the transmission apparatus in association with each other. The circuit records the control data included in the frame to the memory in association with the state information. The circuit changes, when the recording of the control data is completed, the state information to information indicating that the recording of the control data is completed. The circuit determines, when the state information is changed to information indicating that the recording of the control data is completed, whether or not the control data stored in the memory is to be rewritten. The circuit rewrites the control data stored in the memory, upon determining that the control data is rewritten. The circuit changes, when the control data is rewritten, the state information to information indicating that the rewriting of the control data is completed. The circuit reads, when the state information is changed to information indicating that the rewriting of the control data is completed, the control data stored in the memory.

Advantages of the invention will be realized and attained at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 8 is a diagram illustrating a computer for executing a control-data processing program; and.

DESCRIPTION OF EMBODIMENTS

Embodiments of a control-data processing program, a control-data processing method, and a transmission apparatus disclosed herein will be described below in detail with reference to the accompanying drawings. The control-data processing program, the control-data processing method, and the transmission apparatus disclosed herein are not limited to the following embodiments.

[First Embodiment]

Figure 1:
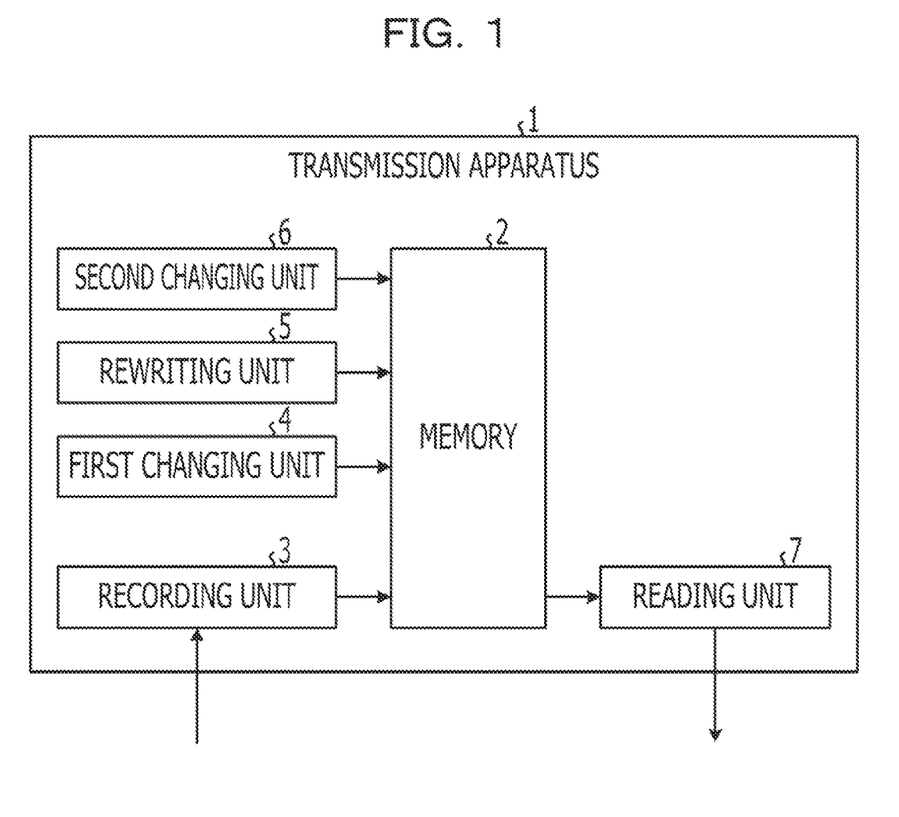
FIG. 1 is a diagram illustrating the configuration of a transmission apparatus according to a first embodiment.

A description will be given of the configuration of a transmission apparatus for executing a control-data processing program according to a first embodiment. FIG. 1 is a diagram illustrating the configuration of a transmission apparatus according to a first embodiment. As illustrated, a transmission apparatus 1 includes a memory 2, a recording unit 3, a first changing unit 4, a rewriting unit 5, a second changing unit 6, and a reading unit 7. The transmission apparatus 1 executes processing on control data received from outside the transmission apparatus 1.

In the memory 2, control data included in a frame received from outside the transmission apparatus 1 and state information indicating a state of the control data in the transmission apparatus are stored in association with each other. The recording unit 3 records the control data included in the frame to the memory 2 in association with the state information. When the recording unit 3 completes the recording of the control data, the first changing unit 4 changes the state information to information indicating that the recording is completed.

When the first changing unit 4 changes the state information, the rewriting unit 5 executes determination processing for determining whether or not the control data stored in the memory 2 is to be rewritten. Upon determining that the control data stored in the memory 2 is to be rewritten, the rewriting unit 5 executes processing for rewriting the control data stored in the memory 2. When the rewriting unit 5 determines that the control data stored in the memory 2 is to be rewritten or the rewriting unit 5 rewrites the control data stored in the memory 2, the second changing unit 6 changes the state information to information indicating that the processing is completed. When the second changing unit 6 changes the state information, the reading unit 7 starts reading of the control data stored in the memory 2.

As described above, the transmission apparatus 1 according to the first embodiment executes processing for starting the reading of the control data, after recording of the control data to the memory 2 and the processing on the control data are completed. Thus, the transmission apparatus 1 according to the first embodiment can suppress misreading of the control data by controlling the timings of the recording and reading of the control data, without using a phase comparator or a Read CLK. That is, in the transmission apparatus 1 according to the first embodiment, a phase comparator and a Read CLK can be eliminated from the circuit and also the circuit scale can be reduced.

[Second Embodiment]

[Configuration of Transmission Apparatus of Second Embodiment]

Figure 2:
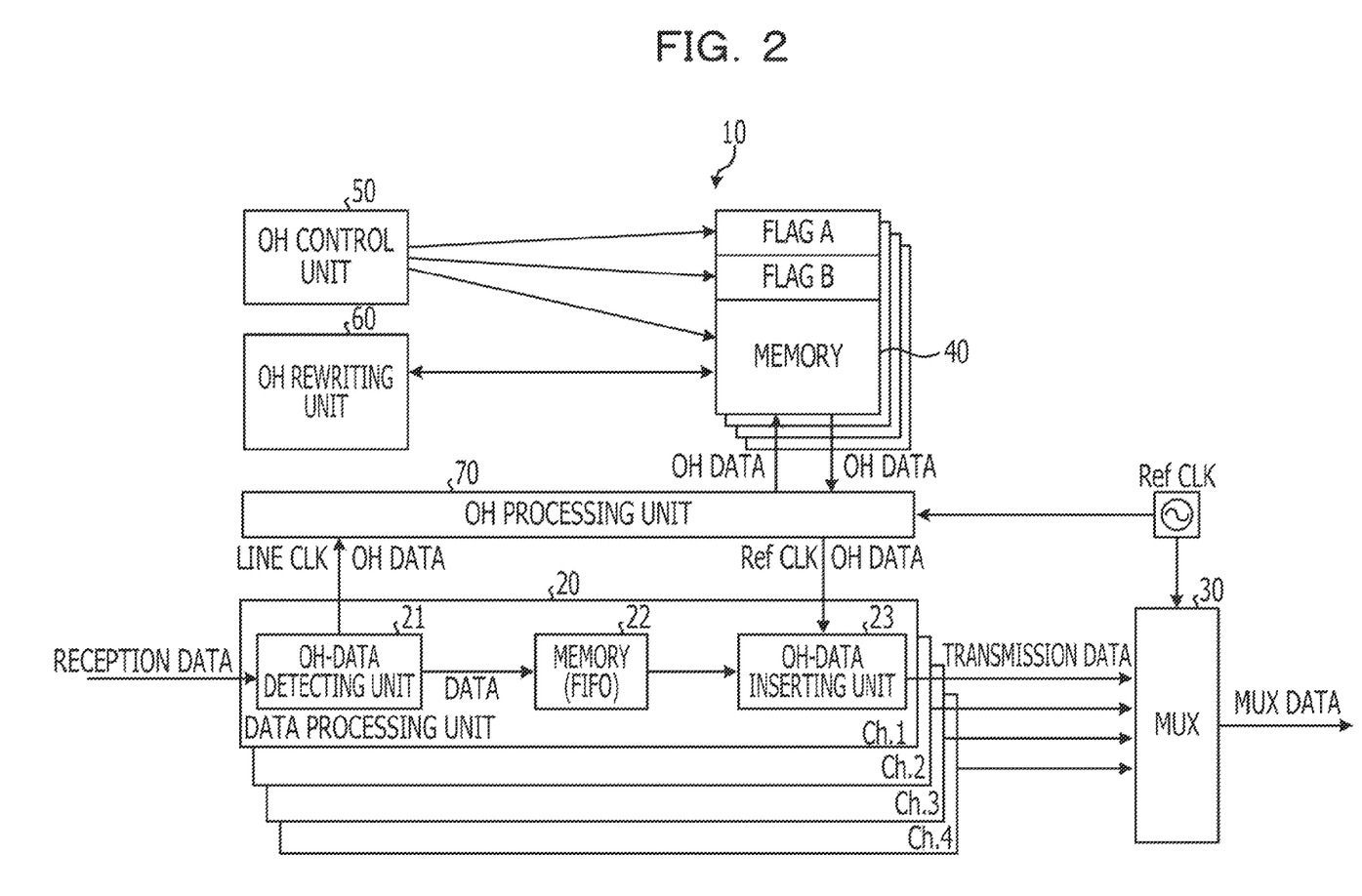
FIG. 2 is a diagram illustrating the configuration of a transmission apparatus according to a second embodiment.

The configuration of a transmission apparatus of a second embodiment will be described first. The transmission apparatus according to a second embodiment is one example of the transmission apparatus of the first embodiment. FIG. 2 is a diagram illustrating the configuration of a transmission apparatus 10 according to the second embodiment. As illustrated in FIG. 2, a transmission apparatus 10 includes Ch. 1 to Ch. 4 data processing units 20, a MUX 30, memories 40, an OH control unit 50, an OH rewriting unit 60, and an OH processing unit 70.

As illustrated in FIG. 2, the transmission apparatus 10 according to the second embodiment has four memories 40 corresponding to the Ch. 1 to Ch. 4 data processing units 20. Since processing operations on the reception data received by the Ch. 1 to Ch. 4 data processing units 20 are substantially the same, processing performed by the Ch. 1 data processing unit 20 will be described below by way of example.

The data processing units 20, the OH control unit 50, the OH rewriting unit 60, and the OH processing unit 70 may be implemented by an integrated circuit, such as an application specific integrated circuit (ASIC) or a field programmable gate array (FPGA). Alternatively, the data processing units 20, the OH control unit 50, the OH rewriting unit 60, and the OH processing unit 70 may be implemented by an electronic circuit, such as a central processing unit (CPU) or a micro processing unit (MPU). Each memory 40 may be a storage device, such as a semiconductor memory device, a hard disk, or an optical disk. Examples of the semiconductor memory device include a read access memory (RAM), a random only memory (ROM), and a flash memory.

As illustrated in FIG. 2, the data processing unit 20 has an OH-data detecting unit 21, a memory 22 (e.g., a FIFO memory), and an OH-data inserting unit 23. The data processing unit 20 executes processing regarding mapping of reception data onto high-speed signals. For example, the transmission apparatus 10 arbitrarily combines 10 Gbps signals of OC-192, STM-64, OTU2, 10GbE, or the like to map the signals onto 40 Gbps signals of OTU3 or the like.

The OH-data detecting unit 21 detects OH data, which is control data included in the reception data. Data included in the reception data is stored in the memory 22. The OH-data inserting unit 23 inserts OH data sent from the OH processing unit 70 (described below) into the data stored by the memory 22, to thereby generate transmission data. The OH-data inserting unit 23 sends the transmission data to the MUX 30 in synchronization with the phase of a reference clock (Ref CLK) for the transmission data.

The MUX 30 multiplexes the transmission data sent from the Ch. 1 to Ch. 4 data processing units 20 to generate MUX data and sends the MUX data in synchronization with the phase of the Ref CLK. In the memory 40, OH data included in a frame and state information indicating a state of the OH data in the transmission apparatus are stored in association with each other. More specifically, OH data that does not have a standard defined for its control time is stored in the memory 40 in association with flags indicating OH-data recording (described below) performed by the OH processing unit 70 is complete. For example, OH data, such as a fault type and fault location (FTFL) used for transmission of fixed data such as an apparatus ID, is stored in the memory 40 in association with a flag A and a flag B.

When the OH processing unit 70 completes the recording of the OH data, the OH control unit 50 changes the state information to information indicating that the recording is completed. When processing (described below) of the OH rewriting unit 60 is completed, the OH control unit 50 changes the state information to information indicating that the processing is completed. More specifically, when the OH processing unit 70 completes the recording of the OH data, the OH control unit 50 changes the value of the flag A or the flag B. When the processing (described below) of the OH rewriting unit 60 is completed, the OH control unit 50 changes the value of the flag A or the flag B.

For example, by using the flag A and the flag B, the OH control unit 50 controls the processing of OH-data recording and reading performed by the OH processing unit 70. For example, the OH control unit 50 initially changes the value of the flag A from "0" to "1". Thereafter, when the OH processing unit 70 completes the recording of the OH data, the OH control unit 50 changes the value of the flag B from "0" to "1".

In addition, when the processing (described below) of the OH rewriting unit 60 is completed, the OH control unit 50 changes the value of the flag A from "1" to "0". Thereafter, when the OH processing unit 70 completes the reading processing, the OH control unit 50 changes the value of the flag B from "1" to "0".

When the OH control unit 50 changes the state information, the OH rewriting unit 60 determines whether or not the OH data stored in the memory 40 is to be rewritten. Upon determining that the OH data is to be rewritten, the OH rewriting unit 60 executes rewriting processing. More specifically, when the OH processing unit 70 completes the recording of the OH data and then the OH control unit 50 changes the value of the flag A or the flag B, the OH rewriting unit 60 determines whether or not the OH data is to be rewritten, on the basis of a signal received from outside the transmission apparatus 10.

Upon determining that the OH data is to be rewritten, the OH rewriting unit 60 rewrites the OH data stored in the memory 40. For example, when the OH control unit 50 changes the value of the flag A to "1" and value of the flag B to "1", the OH rewriting unit 60 determines whether or not the OH data is to be rewritten. For example, upon receiving an alarm transfer signal such as an AIS (alarm indication signal) from outside the transmission apparatus 10, the OH rewriting unit 60 determines that the OH data is to be rewritten and rewrites the FTFL in the OH data so that it indicates an apparatus-setting value.

The OH processing unit 70 records the OH data, included in the frame received from outside the transmission apparatus 10, to the memory 40 in association with the state information. During accommodation of the data, included in the flame received from outside the transmission apparatus 10, into a high-speed transfer frame, the OH processing unit 70 extracts OH data included in the frame received from outside the transmission apparatus 10 and records the extracted OH data to the memory 40 in association with the state information.

More specifically, the OH processing unit 70 records OH data that is included in the OH data detected by the OH-data detecting unit 21, that does not have a standard defined for its control data, and that does not need to be transferred in real time, to the memory 40 in association with the flag A and the flag B. For example, when the reception data transmitted at 10 Gbps of OC-192, STM-64, OTU2, 10GbE, or the like are mapped onto a frame of 40 Gbps of OTU3 or the like, the OH processing unit 70 extracts OH data from the reception data and records the extracted OH data to the memory 40. For example, the OH processing unit 70 extracts OH data, such as an FTFL used for transmission of fixed data such as an apparatus ID, and records the extracted OH data to the write memory 40 in association with the flag A and the flag B.

During recording of the extracted OH data to the memory 40, the OH processing unit 70 refers to the values of the flag A and the flag B. For example, when the value of the flag A is "1" and the value of the flag B is "0", the OH processing unit 70 records the extracted OH data to the memory 40.

When the OH control unit 50 changes the state information, the OH processing unit 70 starts reading of the OH data stored in the memory 40.

Specifically, when the processing of the OH rewriting unit 60 is completed and the OH control unit 50 changes the value of the flag A or the flag B, the OH processing unit 70 starts reading of the OH data stored in the memory 40. For example, when the processing of the OH rewriting unit 60 is completed and the OH control unit 50 changes the value of the flag A to "0" and the value of the flag B to "1", the OH processing unit 70 starts reading of the OH data, such as an FTFL, stored in the memory 40.

According to the transmission apparatus 10 of the second embodiment, the OH control unit 50, the OH rewriting unit 60, and the OH processing unit 70 execute the above-described processing on the reception data respectively received through Ch. 1 to Ch. 4.

[Procedure of Processing performed by Transmission Apparatus of Second Embodiment]

Figure 3:
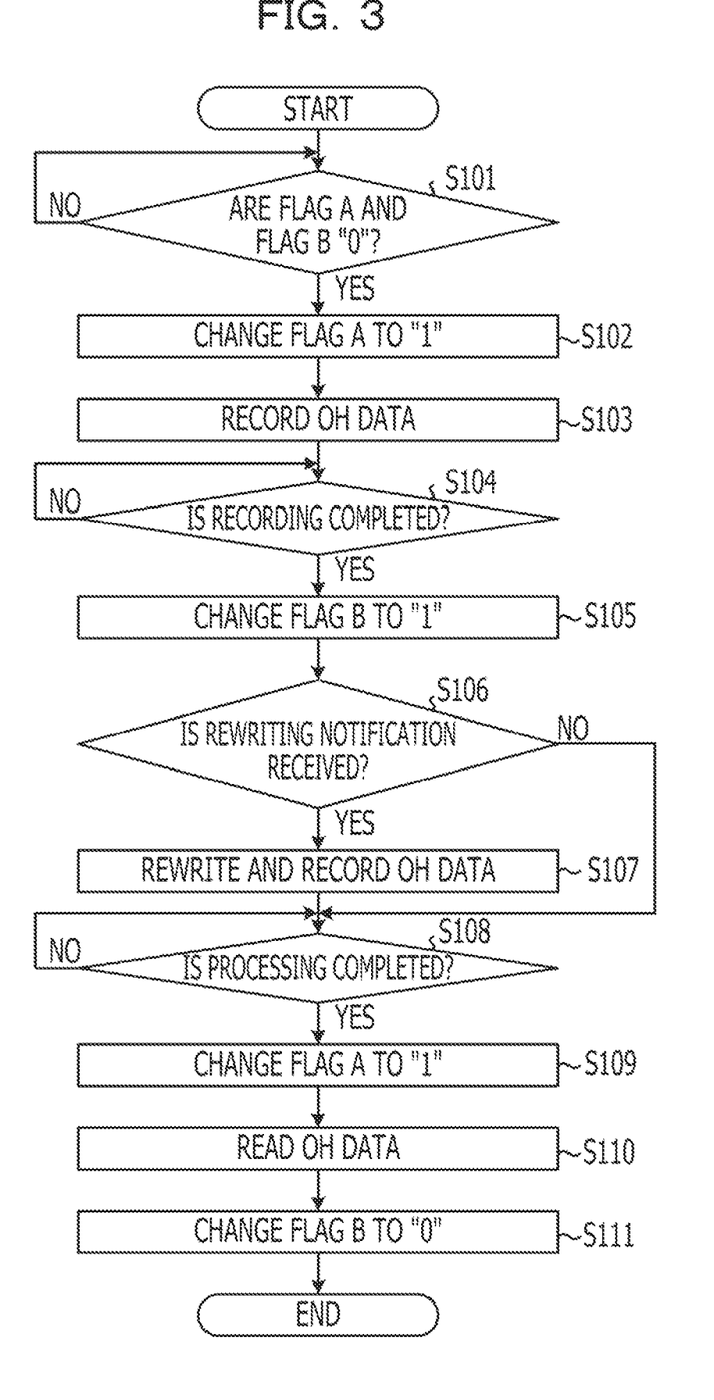
FIG. 3 is a flowchart illustrating a procedure of processing performed by the transmission apparatus according to the second embodiment.

Next, a description will be given of a procedure of processing performed by the transmission apparatus 10 according to the second embodiment. FIG. 3 is a flowchart illustrating a procedure of processing performed by the transmission apparatus 10 according to the second embodiment. As illustrated in FIG. 3, in the transmission apparatus 10 according to the second embodiment, when the values of the flag A and the flag B are "0" (i.e., affirmative in operation S101), the OH control unit 50 changes the value of the flag A to "1" in operation S102.

In operation S103, by referring to the flag A "1" and the flag B "0", the OH processing unit 70 records, to the memory 40, OH data that is included in the OH data detected by the OH-data detecting unit 21 and that does not have a standard defined for its control time. For example, the OH processing unit 70 records the OH data, such as an FTFL, to the memory 40.

In operation S104, the OH control unit 50 determines whether or not the OH processing unit 70 completes the recording of the OH data. Upon determining that the recording is completed (i.e., affirmative in operation S104), the OH control unit 50 changes the value of the flag B to "1" in operation S105. Upon determining that the recording of the OH data is not completed (i.e., negative in operation S104), the OH control unit 50 waits until the OH processing unit 70 completes the recording of the OH data.

In operation S106, by referring to the flag A "1" and the flag B "1", the OH rewriting unit 60 determines whether or not a rewriting notification is received. For example, the OH rewriting unit 60 determines whether or not an alarm transfer signal is received from outside the transmission apparatus 10. Upon determining that a rewriting notification is received (i.e., affirmative in operation S106), the process proceeds to operation S107 in which the OH rewriting unit 60 reads the OH data stored in the memory 40, rewrites the read OH data, and records the rewritten OH data to the memory 40.

For example, the OH rewriting unit 60 rewrites the OH data so that it indicates an apparatus-setting value and records the rewritten value to the memory 40. On the other hand, upon determining that a rewriting notification is not received (i.e., negative in operation S106), the OH rewriting unit 60 records the OH data, read from the memory 40, to the memory 40 without rewriting the OH data.

In operation S108, the OH control unit 50 determines whether or not the processing of the OH rewriting unit 60 is completed. Upon determining that the processing is completed (i.e., affirmative in operation S108), the OH control unit 50 changes the value of the flag A to "0" in operation S109. Upon determining that processing is not completed (i.e., negative in operation S108), the OH control unit 50 waits until the processing of the OH rewriting unit 60 is completed.

In operation S110, by referring to the flag A "0" and the flag B "1", the OH processing unit 70 reads the OH data stored in the memory 40. When the OH processing unit 70 completes the reading of the OH data, the OH control unit 50 changes the value of the flag B to "0" in operation S111 and ends the processing.

[Advantage of Second Embodiment]

As described above, according to the second embodiment, the OH processing unit 70 records the OH data, included in the frame received from outside the transmission apparatus 10, to the memory 40 in association with the state information indicating the state of the OH data in the transmission apparatus 10. When the OH processing unit 70 completes recording of the OH data, the OH control unit 50 changes the state information to information indicating that the recording is completed. When the OH control unit 50 changes the state information, the OH rewriting unit 60 executes determination processing for determining whether or not the OH data stored in the memory 40 is to be rewritten. Upon determining that the OH data is to be rewritten, the OH rewriting unit 60 executes rewriting processing. When the processing of the OH rewriting unit 60 is completed, the OH control unit 50 changes the state information to information indicating that the processing is completed. When the OH control unit 50 changes the state information, the OH processing unit 70 starts reading of the OH data stored in the memory 40. Thus, the transmission apparatus 10 according to the second embodiment can suppress misreading of the OH data by controlling the timings of the recording and reading of the OH data, without using a phase comparator and a Read CLK. That is, in the transmission apparatus 10 according to the second embodiment, a phase comparator and a Read CLK can be eliminated from the circuit and also the circuit scale can be reduced.

Since the transmission apparatus 10 according to the second embodiment can execute processing on the OH data without using a phase comparator and a Read CLK, it is possible to reduce the amount of power consumption, which generally increases in conjunction with complicated control.

In addition, the transmission apparatus 10 according to the second embodiment can control, at a different speed from that for data, the OH data (such as an FTFL) that does not have a standard defined for its control time and that does not need to be transferred in real time. Thus, it is possible to enhance redundancy for data transmission.

According to the second embodiment, when data included in a frame received from outside the transmission apparatus 10 is accommodated into a high-speed transfer frame, the OH processing unit 70 extracts OH data in the frame received from outside the transmission apparatus 10. The OH processing unit 70 records the extracted OH data to the memory 40 in association with the state information. Thus, the transmission apparatus 10 according to the second embodiment can simplify the processing during mapping of low-speed signals onto high-speed signals.

[Third Embodiment]

The description in the second embodiment has been given of a case in which one memory is used for each channel to execute the recording and reading of the OH data. In a third embodiment, a description will be given of a case in which a memory for recording and a memory for reading are used for each channel.

[Configuration of Transmission Apparatus of Third Embodiment]

Figure 4:
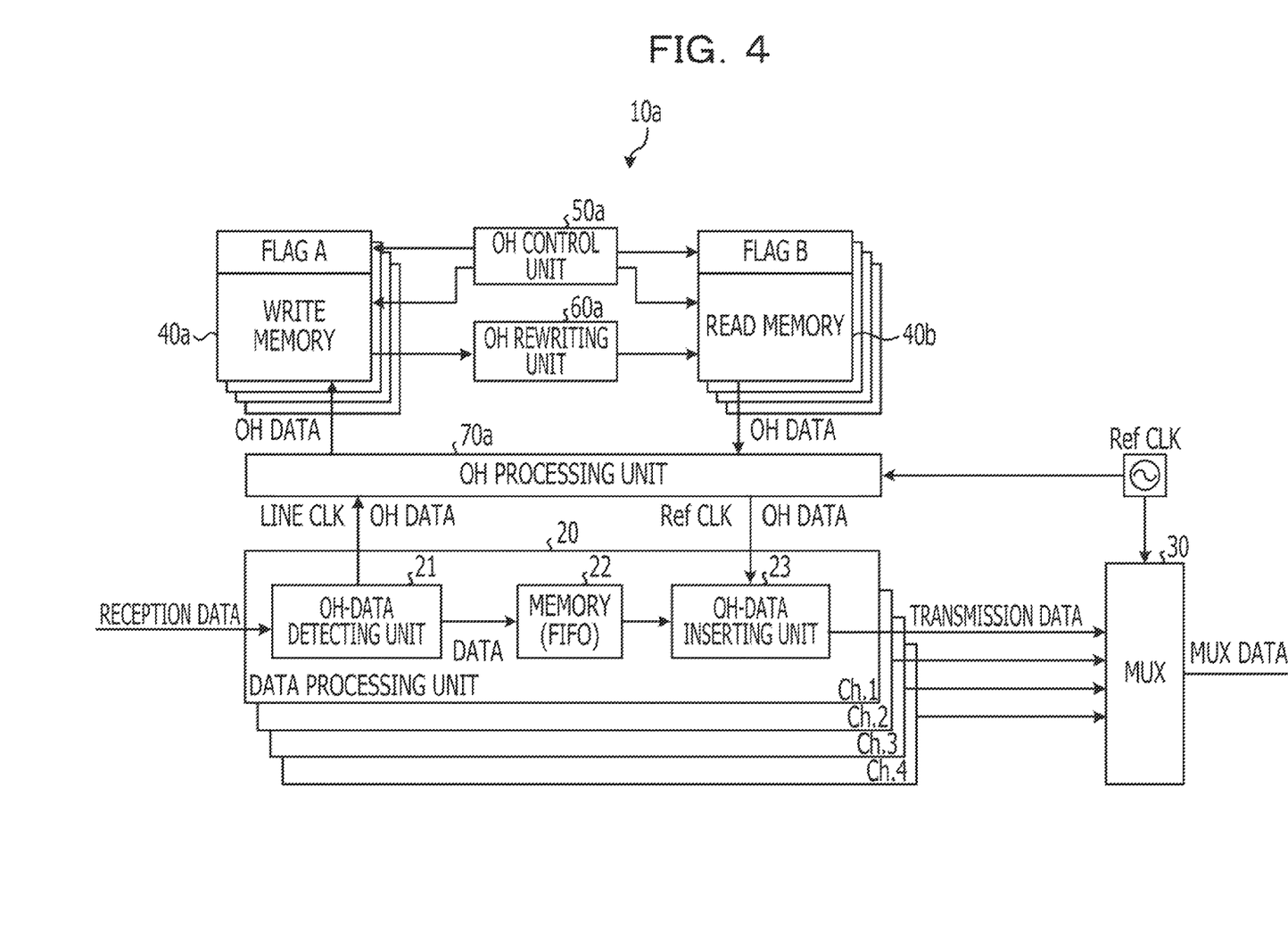
FIG. 4 is a diagram illustrating the configuration of a transmission apparatus according to a third embodiment.

First, a description will be given of a transmission apparatus of a third embodiment. FIG. 4 is a diagram illustrating the configuration of a transmission apparatus 10a according to the third embodiment. As illustrated in FIG. 4, the transmission apparatus 10a according to the third embodiment is different from the transmission apparatus 10 of the second embodiment in that four write memories 40a and four read memories 40b corresponding to the Ch. 1 to Ch. 4 data processing units 20 are provided. As illustrated in FIG. 4, the transmission apparatus 10a according to the third embodiment is further different from the transmission apparatus 10 according to the second embodiment in processing performed by an OH control unit 50a, an OH rewriting unit 60a, and an OH processing unit 70a. The different points will be described below. Since the processing operations on the reception data received by the Ch. 1 to Ch. 4 data processing units 20 are substantially the same, processing performed by the Ch. 1 data processing unit 20 will be described below by way of example.

OH data that does not have a standard defined for its control time is stored in the write memory 40a in association with a flag A. For example, the OH data, such as an FTFL used for transmission of fixed data such as an apparatus ID, is stored in the write memory 40a in association with the flag A. OH data on which processing (described below) performed by the OH rewriting unit 60a is completed is stored in the read memory 40b in association with a flag B. For example, OH data whose FTFL is rewritten by the OH rewriting unit 60a so that the FTFL indicates an apparatus-setting value is stored in the read memory 40b in association with the flag B.

When the OH processing unit 70a completes the recording of the OH data, the OH control unit 50a changes the value of the flag A in the write memory 40a or the value of the flag B in the read memory 40b. When processing (described below) of the OH rewriting unit 60a is completed, the OH control unit 50a changes the value of the flag A in the write memory 40a or the value of the flag B in the read memory 40b.

For example, by using the flag A and the flag B, the OH control unit 50a controls the processing of OH-data recording and reading (which are described below) performed by the OH processing unit 70a. For example, the OH control unit 50a initially changes the value of the flag A in the write memory 40a from "0" to "1". Thereafter, when the OH processing unit 70a completes the recording of the OH data, the OH control unit 50a changes the value of the flag B in the read memory 40b from "0" to "1".

In addition, when the processing (described below) of the OH rewriting unit 60a is completed, the OH control unit 50a changes the value of the flag A in the write memory 40a from "1" to "0". Thereafter, when the OH processing unit 70a completes the reading processing, the OH control unit 50a changes the value of the flag B in the read memory 40b from "1" to "0".

In addition to the determination processing and the rewriting processing, the OH rewriting unit 60a executes moving processing for moving the OH data, stored in a recording area to which the OH data is recorded, to a read area from which the OH data is to be read by the OH processing unit 70a. More specifically, when the OH control unit 50a changes the flag, the OH rewriting unit 60a reads the OH data stored in the write memory 40a and determines whether or not the OH data is to be rewritten. Upon determining that the OH data is to be rewritten, the OH rewriting unit 60a rewrites the read OH data and records the rewritten OH data to the read memory 40b. On the other hand, upon determining that the OH data is not to be rewritten, the OH rewriting unit 60a records the read OH data to the read memory 40b.

For example, the OH rewriting unit 60a refers to the flag A in the write memory 40a and the flag B in the read memory 40b, and when the flag A is "1" and the flag B is "1", the OH rewriting unit 60a determines whether or not the OH data is to be rewritten. For example, upon receiving an alarm transfer signal from outside the transmission apparatus 10a, the OH rewriting unit 60a determines that the OH data is to be rewritten and rewrites the FTFL in the OH data so that it indicates an apparatus-setting value.

The OH processing unit 70a records OH data that is included the OH data detected by the OH-data detecting unit 21, that does not have a standard defined for its control data, and that does not need to be transferred in real time, to the memory 40a in association with the flag A. For example, the OH processing unit 70a extracts the OH data, such as an FTFL used for transmission of fixed data such as an apparatus ID, and records the extracted OH data to the write memory 40a in association with the flag A.

During recording of the extracted OH data to the write memory 40a, the OH processing unit 70a records the extracted OH data to the write memory 40a on the basis of the value of the flag A in the write memory 40a and the flag B in the read memory 40b. For example, the OH processing unit 70a refers to the flag A in the write memory 40a and the flag B in the read memory 40b, and when the flag A is "1" and the flag B is "1", the OH processing unit 70a records the OH data to the write memory 40a.

When the OH control unit 50a changes the flag, the OH processing unit 70a starts reading of the OH data stored in the read memory 40b. For example, when the processing of the OH rewriting unit 60a is completed and the OH control unit 50a changes the value of the flag A in the write memory 40a or the value of the flag B in the memory 40b, the OH processing unit 70a starts reading of the OH data stored in the read memory 40b. For example, the OH processing unit 70a refers to the flag A in the write memory 40a and the flag B in the read memory 40b, and when the flag A is "0" and the flag B is "1", the OH processing unit 70a starts reading of the OH data, such as an FTFL, stored in the read memory 40b.

According to the transmission apparatus 10a of the third embodiment, the OH control unit 50a, the OH rewriting unit 60a, and the OH processing unit 70a execute the above-described processing on the reception data respectively received through Ch. 1 to Ch. 4.

[Procedure of Processing performed by Transmission Apparatus of Third Embodiment]

Figure 5:
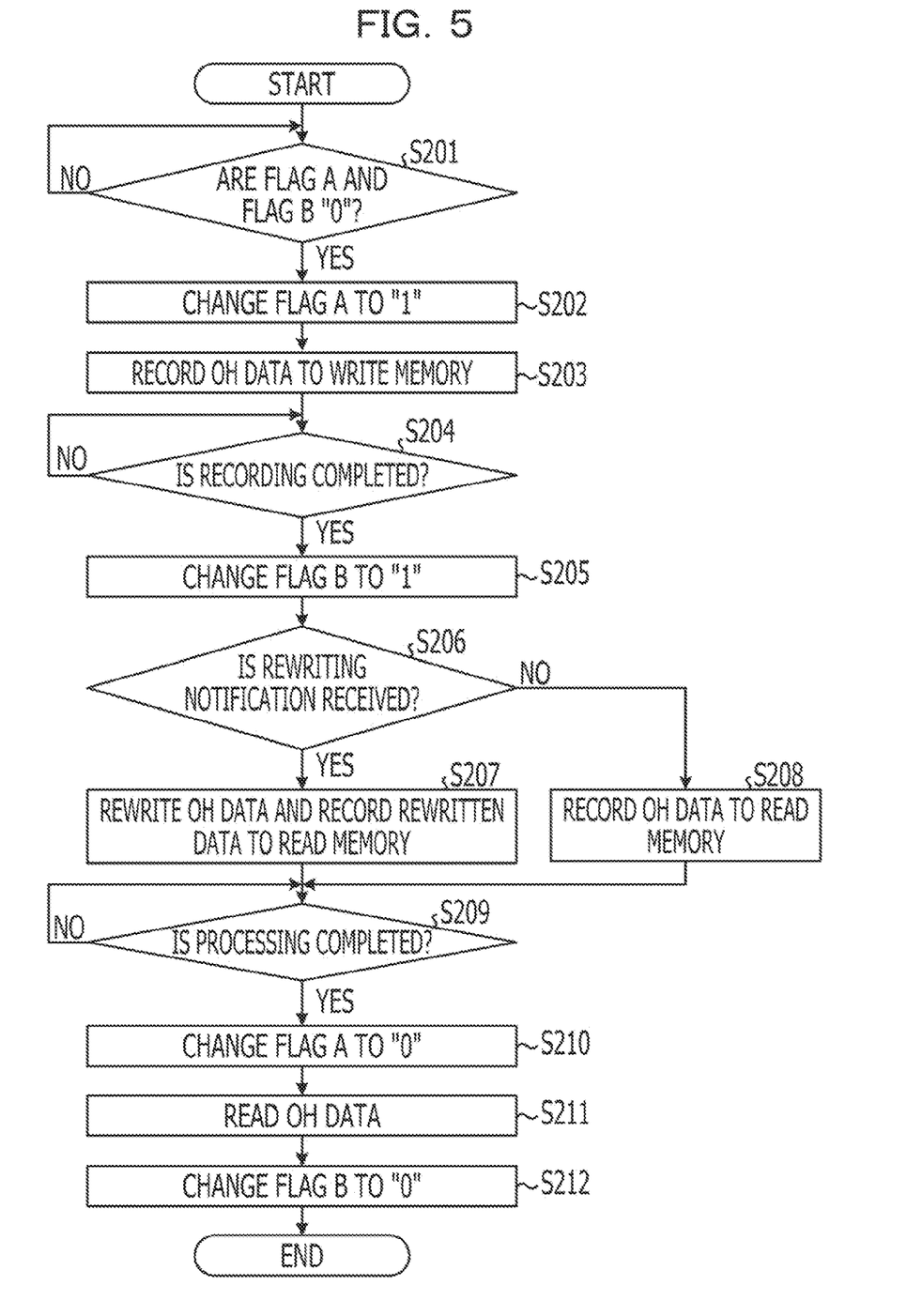
FIG. 5 is a flowchart illustrating a procedure of processing performed by the transmission apparatus according to the third embodiment.

Next, a description will be given of a procedure of processing performed by the transmission apparatus 10a according to the third embodiment. FIG. 5 is a diagram illustrating a procedure of processing performed by the transmission apparatus 10a according to the third embodiment. As illustrated in FIG. 5, in the transmission apparatus 10a according to the third embodiment, when the value of the flag A in the write memory 40a and the value of the flag B in the read memory 40b are "0" (i.e., affirmative in operation S201), the OH control unit 50a changes the value of the flag A in the write memory 40a to "1" in operation S202.

In operation S203, by referring to the flag A "1" and the flag B "0", the OH processing unit 70a records, to the write memory 40a, OH data that does not have a standard defined for its control time. In operation S204, the OH control unit 50a determines whether or not the OH processing unit 70a completes the recording of the OH data.

Upon determining that the recording is completed (i.e., affirmative in operation S204), the OH control unit 50a changes the value of the flag B in the read memory 40b to "1" in operation S205. Upon determining that the recording of the OH data is not completed (i.e., negative in operation S204), the OH control unit 50a waits until the OH processing unit 70a completes the recording of the OH data.

In operation S206, the OH rewriting unit 60a refers to the flag A "1" and the flag B "1" and determines whether or not a rewriting notification is received. Upon determining that a rewriting notification is received (i.e., affirmative in operation S206), the OH rewriting unit 60a reads the OH data stored in the write memory 40a.

In operation S207, the OH rewriting unit 60a rewrites the read OH data and records the rewritten OH data to the read memory 40b. On the other hand, upon determining that a rewriting notification is not received (i.e., negative in operation S206), the process proceeds to operation S208 in which the OH rewriting unit 60a records the OH data, read from the write memory 40a, to the read memory 40b without rewriting the OH data.

In operation S209, the OH control unit 50a determines whether or not the processing of the OH rewriting unit 60a is completed. Upon determining that the processing is completed (i.e., affirmative in operation S209), the OH control unit 50a changes the value of the flag A in the write memory 40a to "0" in operation S210. Upon determining that processing is not completed (i.e., negative in operation S209), the OH control unit 50a waits until the processing of the OH rewriting unit 60a is completed.

Subsequently, in operation S211, by referring to the flag A "0" and the flag B "1", the OH processing unit 70a reads the OH data stored in the read memory 40b. When the OH processing unit 70a completes the reading of the OH data, the OH control unit 50a changes the value of the flag B to "0" in operation S212 and ends the processing.

[Advantage of Third Embodiment]

According to the third embodiment, as described above, the OH rewriting unit 60a executes the moving processing for moving the OH data, stored in the write memory 40a (which is an area to which the OH data is recorded), to the read memory 40b (which is an area from which the OH data is to be read by the OH processing unit 70a). When the OH rewriting unit 60a completes the determination processing, the rewriting processing, and the moving processing, the OH control unit 50a changes the state information to information indicating that the processing is completed. When the OH control unit 50a changes the state information, the OH processing unit 70a starts reading of the OH data stored in the read memory 40b. Thus, the transmission apparatus 10a according to the third embodiment makes it possible to deal with a case in which different processing is executed on the recorded OH data.

[Fourth Embodiment]

The description in the second embodiment has been given of a case in which one memory is used for each channel to execute the recording and reading of the OH data. A fourth embodiment will be given in conjunction with a case in which multiple memories are used for each channel to increase the memory capacity.

[Configuration of Transmission Apparatus of Fourth Embodiment]

Figure 6:
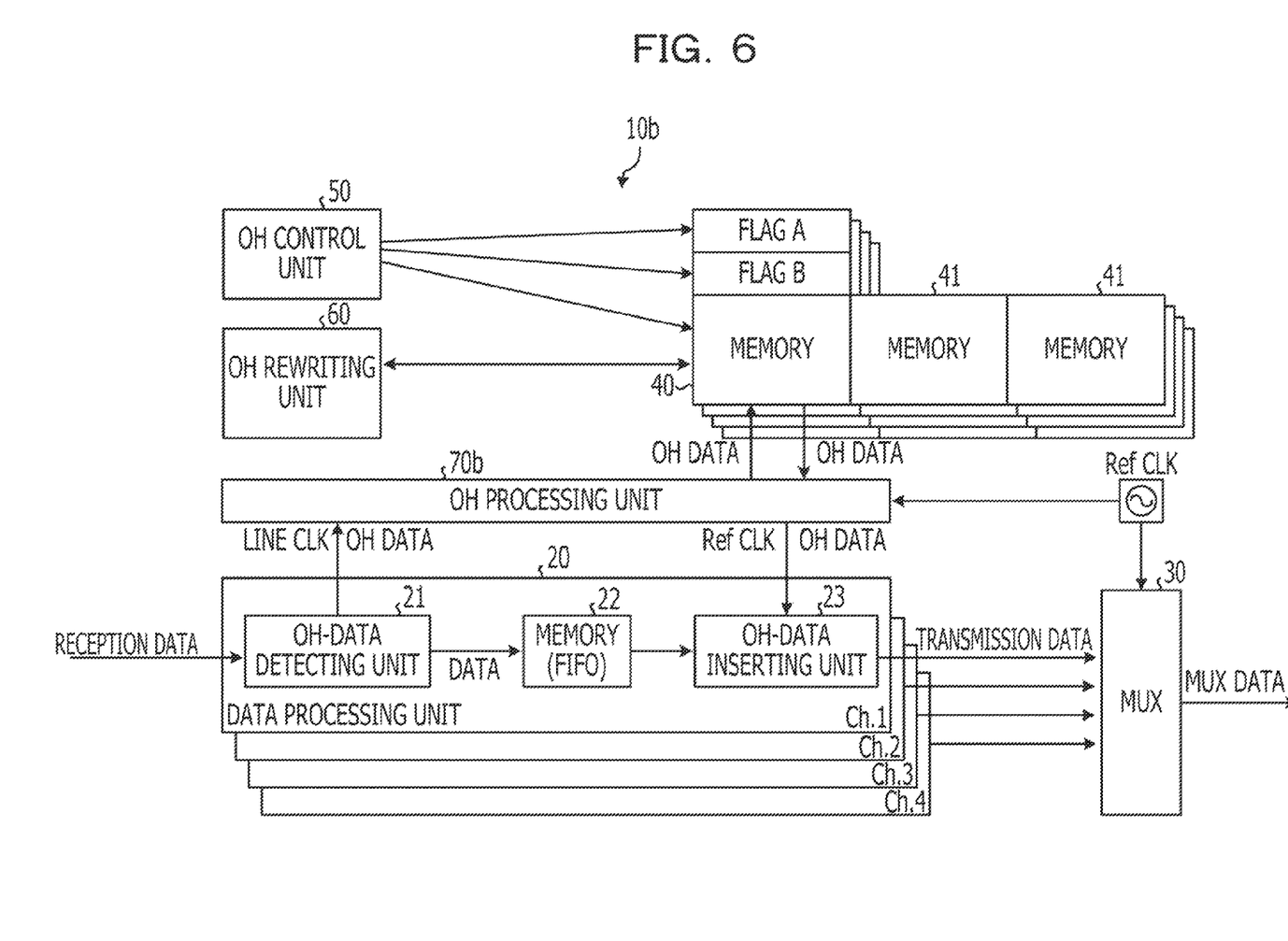
FIG. 6 is a diagram illustrating the configuration of a transmission apparatus according to a fourth embodiment.

First, a description will be given of the configuration of a transmission apparatus of a fourth embodiment. FIG. 6 is a diagram illustrating the configuration of a transmission apparatus 10b according to the fourth embodiment. As illustrated in FIG. 6, the transmission apparatus 10b according to the fourth embodiment is different from the transmission apparatus 10 of the second embodiment in that memories 41 are further provided in addition to the four memories 40 corresponding to the Ch. 1 to Ch. 4 data processing units 20. The transmission apparatus 10b according to the fourth embodiment is further different from the transmission apparatus 10 of the second embodiment in processing performed by an OH processing unit 70b. The different points will be described below. Since the processing operations on the reception data received by the Ch. 1 to Ch. 4 data processing units 20 are substantially the same, processing performed by the Ch. 1 data processing unit 20 will be described below by way of example.

OH data recorded by the OH processing unit 70b is stored in the memories 41. The OH processing unit 70b records OH data that is included the OH data detected by the OH-data detecting unit 21, that does not have a standard defined for its control data, and that does not need to be transferred in real time, to the memory 40 or the memories 41 in association with a flag A and a flag B.

Although the fourth embodiment has been described above in conjunction with a case in which two memories 41 are provided for each channel, the present embodiment is not limited thereto. For example, three memories 41 may be provided for each channel. Since the procedure of processing performed by the transmission apparatus 10b according to the fourth embodiment is similar to the procedure of the processing performed by the transmission apparatus 10 according to the second embodiment, a description thereof is not given hereinafter.

[Advantage of Fourth Embodiment]

As described above, according to the fourth embodiment, the OH processing unit 70b records the OH data to the memory 40 or the memories 41 in association with the flag A and the flag B. Thus, the transmission apparatus 10b according to the fourth embodiment makes it possible to deal with OH data having a large data size.

[Fifth Embodiment]

Although the first to fourth embodiments have been described above, various embodiments other than the first to fourth embodiments may also be implemented. Accordingly, various other embodiments (1) to (5) are individually described below.

(1) Modifications

Figure 7:
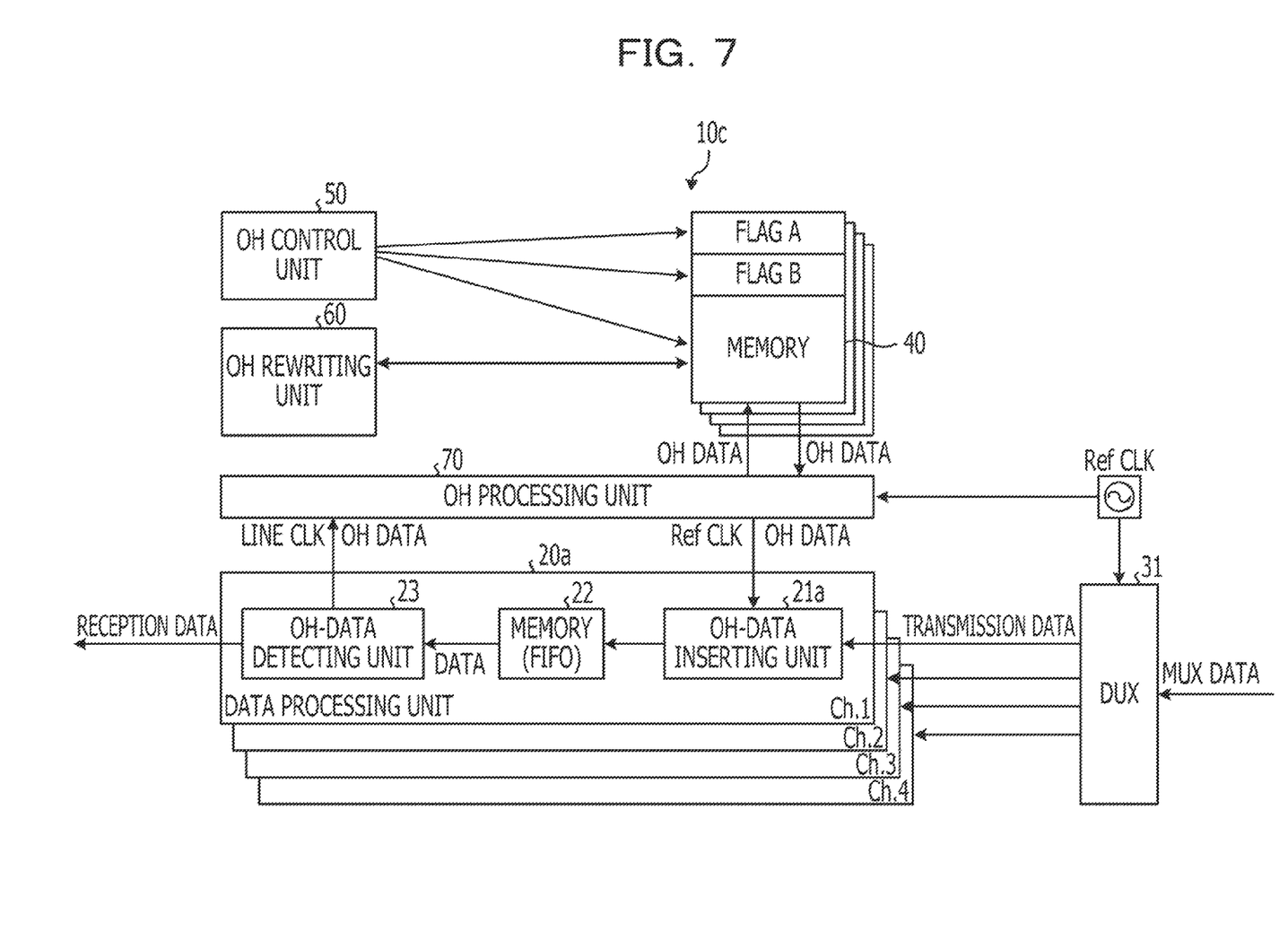
FIG. 7 is a diagram illustrating a modification.

Although a case in which the reception data are mapped onto a frame of high-speed signals has been described above in the second to fourth embodiments, the present embodiment is not limited thereto. For example, the embodiment may also be applied to a case in which data are demapped from high-speed signals. A case in which data are demapped from high-speed signals will now be described with reference to FIG. 7. FIG. 7 is a diagram illustrating a modification.

As illustrated in FIG. 7, a transmission apparatus 10c according to a modification is different from the transmission apparatus 10 of the second embodiment in that a demultiplexer (DMUX) 31 is provided and processing performed by an OH-data detecting unit 21a is different. The different points will be described below.

The DMUX 31 demultiplexes Ch. 1 to Ch. 4 data included in MUX data received from the outside and sends the demultiplexed data to data processing units 20a. The OH-data detecting unit 21a detects OH data included in the data sent from the DMUX 31. That is, the OH processing unit 70 executes processing on the OH data of the data demapped from the high-speed signals. With this configuration, the transmission apparatus 10c according to the modification can simplify the processing during data demapping from high-speed signals.

The description in the modification has been given of a case in which, with respect to the demapped data, one memory is used for each channel to execute the recording and reading of the OH data. The embodiment, however, is not limited to the configuration. For example, with respect to the demapped data, a write memory and a read memory may also be used to execute recording and reading of the OH data.

(2) The Number of Channels

Although cases in which four channels, i.e., Ch. 1 to Ch. 4, are used have been described above in the second to fourth embodiments and the modification, the embodiment is not limited thereto and may be applied to a case in which the number of channel is, for example, 5.

(3) The Number of Flags

Although cases in which a pair of flags A and B is used for the memory or memories have been described above in the second to fourth embodiments and the modification, the present embodiment is not limited thereto and may be applied to a case in which two pairs of flags A and B are used for the memory or memories.

(4) System Configuration, Etc.

The elements of the illustrated apparatuses are merely functional concepts and do not necessarily have to be physically the same as those illustrated. That is, specific forms of separation/integration of the apparatuses are not limited to those illustrated, and all or a portion thereof may be functionally or physically separated or integrated in an arbitrary manner, depending on various loads, a use state, and so on. For example, the OH rewriting unit 60 and the OH processing unit 70 illustrated in FIG. 2 may be integrated together as one control unit. On the other hand, the OH processing unit 70 illustrated in FIG. 2 may be separated into a recording unit for recording OH data and a reading unit for reading OH data.

(5) Control Data Processing Programs

Figure 8:
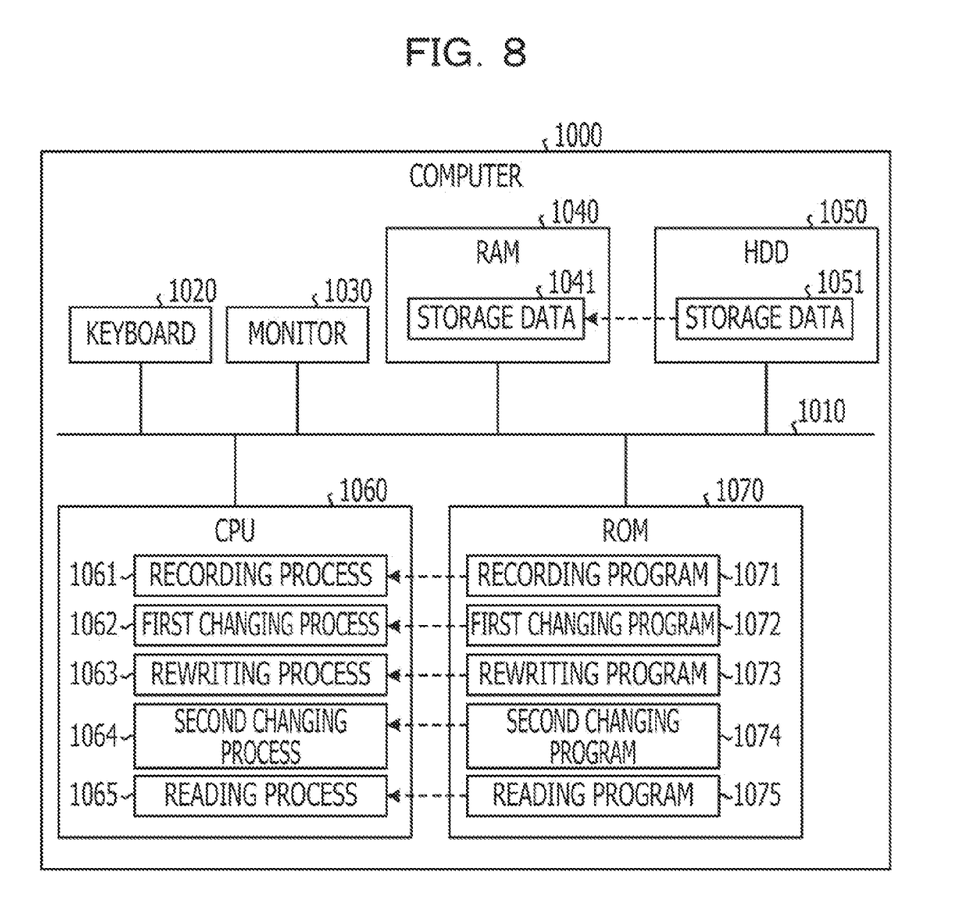

Although a case in which the various types of processing are achieved using hardware logic has been described above in the first embodiment, the present embodiment is not limited thereto and a prepared program may be executed using a computer. Accordingly, one example of a computer for executing a control-data processing program that provides substantially the same functions as those of the transmission apparatus 1 according to the first embodiment will be described below with reference to FIG. 8. FIG. 8 is a diagram illustrating a computer for executing a control-data processing program.

As illustrated in FIG. 8, a computer 1000 serving as an information processing apparatus includes a keyboard 1020, a monitor 1030, a RAM 1040, a HDD 1050, a CPU 1060, and a ROM 1070. The keyboard 1020, the monitor 1030, the RAM 1040, the HDD 1050, the CPU 1060, and the ROM 1070 are coupled through a bus 1010 or the like.

The ROM 1070 pre-stores a control-data processing program that provides substantially the same functions as those of the transmission apparatus 1 according to the first embodiment described above. As illustrated in FIG. 8, the control-data processing program includes a recording program 1071, a first changing program 1072, a rewriting program 1073, a second changing program 1074, and a reading program 1075. The programs 1071 to 1075 may be integrated together or may be separated from one another as appropriate, as in the elements of the transmission apparatus 1 illustrated in FIG. 1.

The CPU 1060 reads the programs 1071 to 1075 from the ROM 1070 and executes the programs 1071 to 1075, so that they function as individual processes as illustrated in FIG. 8. That is, the programs 1071 to 1075 function as a recording process 1061, a first changing process 1062, a rewriting process 1063, a second changing process 1064, and a reading process 1065. The processes 1061 to 1065 correspond to the recording unit 3, the first changing unit 4, the rewriting unit 5, the second changing unit 6, and the reading unit 7 illustrated in FIG. 1.

The HDD 1050 contains storage data 1051, as illustrated in FIG. 8. The storage data 1051 corresponds to the memory 2 illustrated in FIG. 1. The CPU 1060 registers storage data 1041 with the storage data 1051, reads the storage data 1041, and records the read storage data 1041 to the RAM 1040. On the basis of the storage data 1041 recorded to the RAM 1040, the CPU 1060 executes control-data processing.

The programs 1071 to 1075 do not initially have to be stored in the ROM 1070, and the programs may be stored in an alternative storage medium or storage device so that the computer 1000 reads the programs therefrom for execution. The alternative storage medium or storage device may be a portable physical medium loaded into the computer 1000. Examples include a flexible disk (FD), CD-ROM (compact disk—read only memory), MO (magneto optical) disk, DVD (digital versatile disk), and IC (integrated circuit) card. The alternative storage medium or storage device may also be, for example, a fixed physical medium, such as a HDD, provided inside/outside the computer 1000. The alternative storage medium or storage device may also be another computer (or server) connected to the computer 1000 over a public network, the Internet, a LAN (local area network), and/or a WAN (wide area network).

The disclosed programs make it possible to reduce the circuit scale.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments of the invention have been described in detail, it should be understood that the various changes, substitutions, and alterations could be made hereto without departing from the spirit and scope of the invention.

What is claimed is:

1. A transmission apparatus comprising:
    a memory in which control data included in a frame received from outside the transmission apparatus and state information indicating a state of the control data in the transmission apparatus are stored in association with each other;
    a circuit to execute:
    detecting the control data from the frame received from outside the transmission apparatus;
    recording the control data detected to the memory in association with the state information;
    performing a first changing process of changing, when the recording of the control data is completed, the state information to information indicating that the recording of the control data is completed;
    determining, when the state information is changed to information indicating that the recording of the control data is completed, whether or not the control data stored in the memory is to be rewritten;
    rewriting the control data stored in the memory, upon determining that the control data is rewritten;
    performing a second changing process of changing, when the control data is rewritten, the state information to information indicating that the rewriting of the control data is completed;
    reading, when the state information is changed to information indicating that the rewriting of the control data is completed, the control data stored in the memory; and
    inserting the control data, that has been rewritten, into the frame so that the frame including the rewritten control data is transmitted from the transmission apparatus.

2. The transmission apparatus according to claim 1, wherein when data included in the frame received from outside the transmission apparatus is accommodated into a frame having a transfer speed that is higher than a transfer speed of the frame received from outside the transmission apparatus, the control data included in the frame received from outside the transmission apparatus is extracted and the extracted control data is recorded to the memory in association with the state information.

3. The transmission apparatus according to claim 1, wherein when a frame containing multiple pieces of data is received from outside the transmission apparatus, control data respectively included in the multiple pieces of data demultiplexed from the frame are recorded to the memory.

4. The transmission apparatus according to claim 1, wherein, in the rewriting process, moving processing to move the control data, stored in a recording area to which the control data is recorded, to a read area from which the control data is to be read in the reading process is executed in addition to the determination processing and the rewriting processing;
    when the moving processing is completed in the rewriting process, the state information is changed in the second changing process to information indicating that the moving processing is completed; and
    when the state information is changed in the second changing process, the reading of the control data stored in the read area is started in the reading process.

5. A control-data processing method comprising:
    detecting control data from a frame received from outside an apparatus;
    recording the control data detected to a memory in association with state information indicating a state of the control data in the apparatus;
    changing, when the recording of the control data is completed, the state information to information indicating that the memory of the control data is completed;
    executing determination processing for determining, when the state information is changed, whether or not the control data stored in the memory is to be rewritten, and to execute, upon determining that the control data is to be rewritten, rewriting processing to rewrite the control data stored in the memory;
    changing, when the determination processing or the rewriting processing is completed, the state information to information indicating that the determination processing or the rewriting processing is completed;
    starting reading of the control data stored in the memory, when the state information is changed; and
    inserting the control data, that has been rewritten, into the frame so that the frame including the rewritten control data is transmitted from the apparatus.

6. The control-data processing method according to claim 5, wherein, when data included in the frame received from outside the apparatus is accommodated into a frame having a transfer speed that is higher than a transfer speed of the frame received from outside the apparatus, the control data included in the frame received from outside the apparatus is extracted and the extracted control data is recorded to the memory in association with the state information.

7. The control-data processing method according to claim 5, wherein, when a frame containing multiple pieces of data is received from outside the apparatus, control data respectively included in the multiple pieces of data demultiplexed from the frame are recorded to the memory in association with the state information indicating the state of the control data in the apparatus.

8. The control-data processing method according to claim 5, wherein, moving processing to move the control data, stored in a recording area to which the control data is recorded, to a read area from which the control data is to be read is executed in addition to the determination processing and the rewriting processing;
when the moving processing is completed, the state information is changed to information indicating that the moving processing is completed; and
when the state information is changed, the reading of the control data stored in the read area is started.

9. A non-transitory computer-readable recording medium encoded with a control-data processing program containing instructions executable on a computer, the program causing the computer to execute:
detecting control data from a frame received from outside an apparatus;
recording the control data detected to a memory in association with state information indicating a state of the control data in the apparatus;
performing a first changing process of changing, when the recording of the control data is completed, the state information to information indicating that the recording of the control data is completed;
determining, when the state information is changed to information indicating that the recording of the control data is completed, whether or not the control data stored in the memory is to be rewritten;
rewriting the control data stored in the memory, upon determining that the control data is rewritten;
performing a second changing process of changing, when the control data is rewritten, the state information to information indicating that the rewriting of the control data is completed;
reading, when the state information is changed to information indicating that the rewriting of the control data is completed, the control data stored in the memory; and
inserting the control data, that has been rewritten, into the frame so that the frame including the rewritten control data is transmitted from the apparatus.

10. The non-transitory computer-readable recording medium according to claim 9, wherein when data included in the frame received from outside the apparatus is accommodated into a frame having a transfer speed that is higher than a transfer speed of the frame received from the outside, the control data included in the frame received from the outside is extracted and the extracted control data is recorded to the memory in association with the state information.

11. The non-transitory computer-readable recording medium according to claim 9, wherein when a frame containing multiple pieces of data is received from outside the apparatus, control data respectively included in the multiple pieces of data demultiplexed from the frame are recorded to the memory.

12. The non-transitory computer-readable recording medium according to claim 9, wherein, in the rewriting process, moving processing to move the control data, stored in a recording area to which the control data is recorded, to a read area from which the control data is to be read in the reading process is executed in addition to the determination processing and the rewriting processing;
when the moving processing is completed in the rewriting process, the state information is changed in the second changing process to information indicating that the moving processing is completed; and
when the state information is changed in the second changing process, the reading of the control data stored in the read area is started in the reading process.

* * * * *